(12) United States Patent
Farys et al.

(10) Patent No.: US 11,150,388 B2
(45) Date of Patent: Oct. 19, 2021

(54) OPTICAL DIFFUSER AND ITS METHOD OF MANUFACTURE

(71) Applicant: STMICROELECTRONICS (CROLLES 2) SAS, Crolles (FR)

(72) Inventors: Vincent Farys, Saint Martin d'Hères (FR); Alain Inard, Saint Nazaire les Eymes (FR); Olivier Noblanc, Grenoble (FR)

(73) Assignee: STMICROELECTRONICS (CROLLES 2) SAS, Crolles (FR)

( * ) Notice: Subject to any disclaimer, the term of this patent is extended or adjusted under 35 U.S.C. 154(b) by 939 days.

(21) Appl. No.: 15/610,150

(22) Filed: May 31, 2017

(65) Prior Publication Data

US 2018/0143357 A1 May 24, 2018

(30) Foreign Application Priority Data

Nov. 21, 2016 (FR) ...................................... 1661301

(51) Int. Cl.
| | |
|---|---|
| *G02B 5/02* | (2006.01) |
| *C23C 16/34* | (2006.01) |
| *C23C 16/56* | (2006.01) |
| *C23C 18/12* | (2006.01) |

(52) U.S. Cl.
CPC .......... *G02B 5/0263* (2013.01); *C23C 16/345* (2013.01); *C23C 16/56* (2013.01); *C23C 18/1208* (2013.01); *G02B 5/0236* (2013.01); *G02B 5/0268* (2013.01)

(58) Field of Classification Search
CPC .. G02B 5/0263; G02B 5/0236; G02B 5/0268; C23C 16/345; C23C 16/56; C23C 18/1208
USPC .......................................................... 359/599
See application file for complete search history.

(56) References Cited

U.S. PATENT DOCUMENTS

| | | | | |
|---|---|---|---|---|
| 5,390,085 A | * | 2/1995 | Mari-Roca | ........... G02B 6/0018 362/23.15 |
| 5,781,164 A | * | 7/1998 | Jacobsen | .............. G09G 3/3622 345/206 |
| 2009/0116790 A1 | | 5/2009 | Mossberg et al. | |
| 2015/0378069 A1 | | 12/2015 | Yamamoto et al. | |

FOREIGN PATENT DOCUMENTS

WO 2013/093741 A1 6/2013

* cited by examiner

*Primary Examiner* — Marin Pichler
*Assistant Examiner* — Mitchell T Oestreich
(74) *Attorney, Agent, or Firm* — Seed IP Law Group LLP

(57) ABSTRACT

Methods of manufacture of an optical diffuser. In one embodiment, an optical diffuser is formed by providing a wafer including a silicon slice of which an upper face is covered with a first layer made of a first material itself covered with a second layer made of a second selectively etchable material with respect to the first material. The method further includes forming openings in the second layer extending up to the first layer and filling the openings in the second layer with a third material. The method yet further includes bonding a glass substrate to the wafer on the side of its upper face and removing the silicon slice.

15 Claims, 8 Drawing Sheets

OPTICAL DIFFUSER AND ITS METHOD OF MANUFACTURE

BACKGROUND

Technical Field

The present disclosure relates to an optical diffuser and its method of manufacture.

Description of the Related Art

An optical diffuser is an optical device that, when it is traversed by a light beam such as a laser beam, it diffuses (diffracts) this beam. The beam thus diffused is, for example, used for illuminating a wide portion of a scene, the image of which is to be obtained, e.g., with an image sensor.

Here optical diffusers are considered consisting of diffusing patterns or diffusing microstructures, and more particularly the case where these patterns have "organic" shapes, i.e., these shapes have curved outlines and evoke shapes that are found in biology. The optical properties of the diffuser depend on the dimensions, and in particular on the thickness, of the diffusing patterns and these dimensions must be precisely controlled.

Such an optical diffuser may be obtained by etching patterns in a glass substrate. However, this involves the use of special techniques of etching on glass and special equipment for implementing this etching.

Such an optical diffuser may also be obtained by forming patterns by nanoprinting, stamping or molding by injecting a polymer material but the use of a polymer material may pose problems for some applications.

BRIEF SUMMARY

It would therefore be desirable to have a diffuser in which the method of manufacture is simple, inexpensive and compatible with conventional methods of manufacture of microelectronic components on silicon. Conventional equipment, currently used in the field of microelectronics on silicon, may then be used without modifications.

One embodiment provides a method of manufacture of an optical diffuser including the following successive steps:

a) providing a wafer including a silicon slice of which an upper face is covered with a first layer made of a first material itself covered with a second layer made of a second selectively etchable material with respect to the first material;

b) forming openings in the second layer extending up to the first layer;

c) filling the openings in the second layer with a third material;

d) bonding a glass substrate to the wafer on the side of its upper face; and e) removing the silicon slice.

According to one embodiment, the third material is selectively etchable with respect to the second material and step c) includes the following successive steps:

c1) depositing a third layer of the third material on a thickness appropriate for filling the openings in the second layer; and c2) smoothing the third layer.

According to one embodiment, step c2) includes the following successive steps:

c21) forming, on the third layer, a second complementary mask of a first mask for defining the openings in the second layer;

c22) removing, according to the pattern of the second mask, a part of the thickness of the exposed portions of the third layer; and c23) smoothing the third layer.

According to one embodiment, in step c2), the third layer is smoothed up to the upper level of the second layer, the method further including, between steps c2) and d), the deposition of a fourth layer of the first material on the side of the upper face of the wafer.

According to one embodiment, in step c2), the third layer is smoothed up to the upper level of the second layer, the method further including, between steps c2) and d), the following successive steps:

f1) depositing a fourth layer made of the first material covering the wafer on the side of its upper face;

f2) depositing a fifth layer made of the second material on the fourth layer;

f3) forming openings in the fifth layer by etching up to the fourth layer;

f4) depositing a sixth layer of the third material with a thickness greater than that of the fifth layer;

f5) smoothing the sixth layer up to the upper level of the fifth layer; and f6) depositing a seventh layer made of the first material on the side of the upper face of the wafer.

According to one embodiment:

in step b), a masking layer for defining the openings in the second layer is made of the first material and rests on the second layer;

in step c1), the masking layer is left in place; and in step c2), the third layer is smoothed up to the upper level of the masking layer, the method further including, between steps c2) and d), the following successive steps:

g1) depositing a fourth layer of the second material covering the wafer on the side of its upper face;

g2) forming openings in the fourth layer by etching up to the masking layer;

g3) depositing a fifth layer made of the third material with a thickness greater than that of the fourth layer;

g4) smoothing the fifth layer up to the upper level of the fourth layer; and g5) depositing a sixth layer made of the first covering material on the upper face of the wafer.

According to one embodiment, the first material is silicon oxide, the second material is silicon nitride, and the third material is polycrystalline or amorphous silicon.

One embodiment provides an optical diffuser including, on a glass substrate, a stack of layers successively comprising:

a first layer of a first material;

a diffusing layer consisting of first patterns made of a second material separated from each other by second patterns made of a third material; and a second layer made of the first material.

According to one embodiment, the stack further includes:

a third layer of the first material resting on the substrate; and another diffusing layer consisting of first patterns made of the second material separated from each other by second patterns made of the third material, said other diffusing layer resting on the third layer and being covered with the first layer.

According to one embodiment, at least some of the first patterns of the diffusing layer each include at least two portions of the second material superposed and separated from each other by portions of a layer of the first material.

According to one embodiment, said at least two portions of said at least some first patterns have different lateral dimensions.

According to one embodiment, the first material is silicon oxide, the second material is silicon nitride, and the third material is polycrystalline or amorphous silicon.

According to one embodiment, the patterns have "organic" shapes.

BRIEF DESCRIPTION OF THE SEVERAL VIEWS OF THE DRAWINGS

These features and advantages, as well as others, will be disclosed in detail in the following description of particular embodiments made non-restrictively in relation to the attached figures in which.

DETAILED DESCRIPTION

The same elements have been designated by the same references in the different figures and, in addition, the various figures are not drawn to scale. For the sake of clarity, only the elements useful to the understanding of the embodiments described have been represented and are described in detail.

In the description that follows, when reference is made to such terms as "above", "upper", "lower", etc., reference is made to the orientation of the elements associated in the corresponding figures. Unless otherwise specified, the term "substantially" means within 10%, preferably within 5%.

Figure 1A:
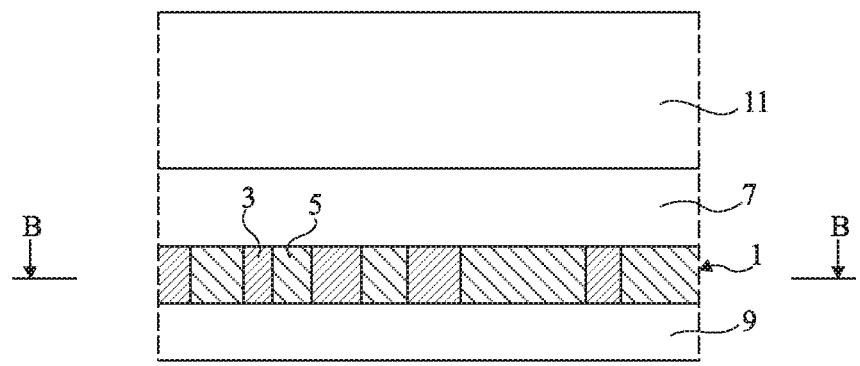
FIGS. 1A and 1B illustrate an embodiment of an optical diffuser.
Figure 1B:
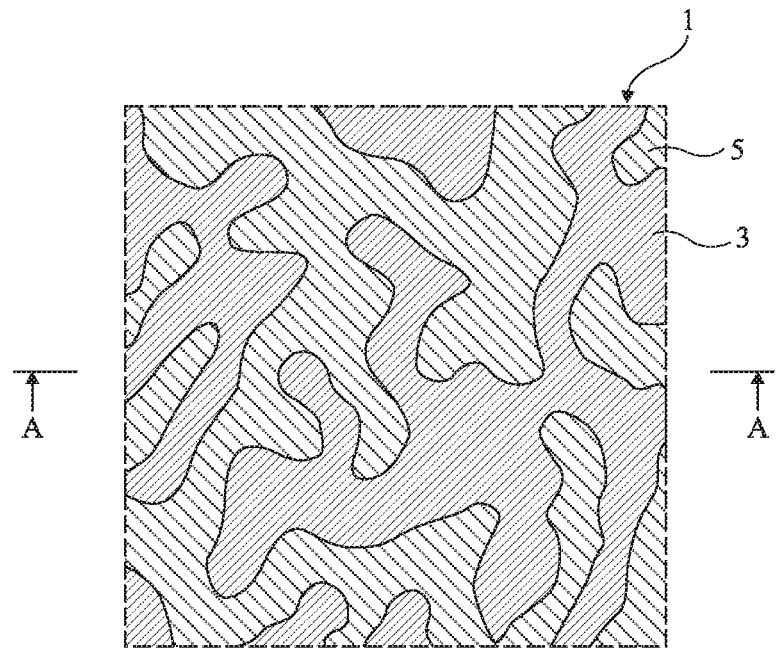

FIGS. 1A and 1B schematically illustrate a portion of an embodiment of an optical diffuser, FIG. 1A being a sectional view along the plane AA of FIG. 1B and FIG. 1B being a view from above in the plane BB of FIG. 1A.

The optical diffuser includes a diffusing layer 1 including first patterns 3 made of a first material separated from each other by second patterns 5, complementary to the first patterns 3, made of a second material, the materials of the patterns 3 and 5 having different optical indices. As seen in FIG. 1B, in this embodiment the patterns 3 and 5 have "organic" shapes. The optical diffuser further includes two layers 7 and 9 made of a same third material, the diffusing layer 1 being in contact with, and sandwiched between, these two layers 7 and 9. A glass substrate 11 transparent to the wavelength of the beam to be diffused rests on the layer 7.

For given materials and a beam to be diffused at a given wavelength, the determination of the shape of the patterns 3, 5 and the thicknesses of the layers 1, 7 and 9 is within the grasp of a person skilled in the art and will not be detailed here. As an example, the first material for forming the patterns 3 is silicon nitride, the second material for forming the patterns 5 is polycrystalline or amorphous silicon, and the third material for forming the layers 7 and 9 is silicon oxide. It will be noted that these materials have optical properties well suited to the case of a beam to be diffused in the near infrared. For these materials and for a beam to be diffused of a wavelength of 940 nm, the optimum thickness of the diffusing layer 1 is equal to 239 nm. For ensuring good optical performance the thickness of the diffusing layer 1 must be as close as possible, e.g., more or less within 5%, of the optimum thickness of this layer 1.

For forming the diffuser in FIGS. 1A and 1B, successively forming the layers 7, 1 and 9 directly on a glass plate could be considered, which would then be cut in order to obtain multiple optical diffusers of the type in FIGS. 1A and 1B. However, the formation of layers directly on a glass plate poses various problems. In particular, this involves the use of specialized equipment first for manipulating the glass plate, and, secondly, for aligning this glass plate with the various etching masks necessary for the manufacture of the diffusers.

Moreover, methods are known for manufacturing microelectronic components on a silicon slice. The steps in these methods and the equipment allowing their implementation are well understood. Thus, for manufacturing a diffuser of the type in FIGS. 1A and 1B, here provision is made to use methods and equipment for manufacturing microelectronic components on silicon by forming the layers of the optical diffuser on a silicon slice, by transferring the structure obtained onto a glass plate, then eliminating the silicon slice.

For the sake of simplification, the rest of the description will be made in the case of the example described in relation to FIGS. 1A and 1B, i.e., in the case where the patterns 3 are made of silicon nitride, the complementary patterns 5 are made of polycrystalline silicon or amorphous silicon, and the layers 7 and 9 are made of silicon oxide. However, the person skilled in the art will understand that other materials may be used according to the intended application, e.g., for producing diffusers operating in specific wavelength ranges. These other materials must notably satisfy the properties of etching selectivity appropriate to the materials referred to here as an example.

FIGS. 2A to 2H are sectional views representing a wafer at successive steps of manufacture of a diffuser of the type in FIGS. 1A and 1B. In these figures, only a portion of the wafer is represented on the understanding that, in practice, multiple optical diffusers are formed simultaneously on the wafer, these diffusers then being individually separated by cutting up the wafer, e.g., by sawing or laser cutting, etc. the wafer.

Figure 2A:
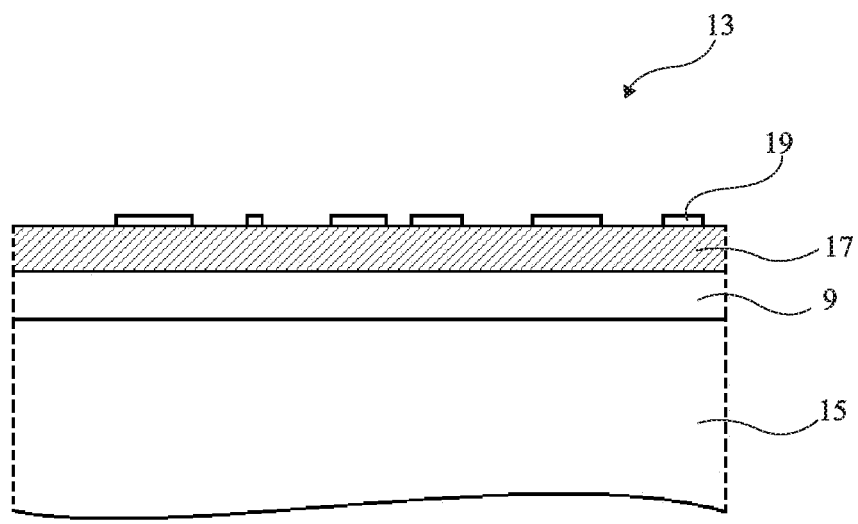
FIGS. 2A to 2H are sectional views illustrating the successive steps of an embodiment of a method of manufacture of the diffuser in FIGS. 1A and 1B.

In the step in FIG. 2A, the wafer 13 includes a silicon slice 15. A layer 9 of silicon oxide has been formed on the silicon slice 15, e.g., by thermal oxidation. A layer 17 of silicon nitride, with a thickness equal to that of the diffusing layer 1 that it is intended to manufacture, has been formed on the layer 9, e.g., by vapor phase chemical deposition. Silicon nitride is selected since it is selectively etchable with respect to silicon oxide. A first mask, of which only one layer 19 is represented, has been formed on the layer 17, the mask including openings of the shape of the patterns 3 intended to be formed.

Figure 2B:
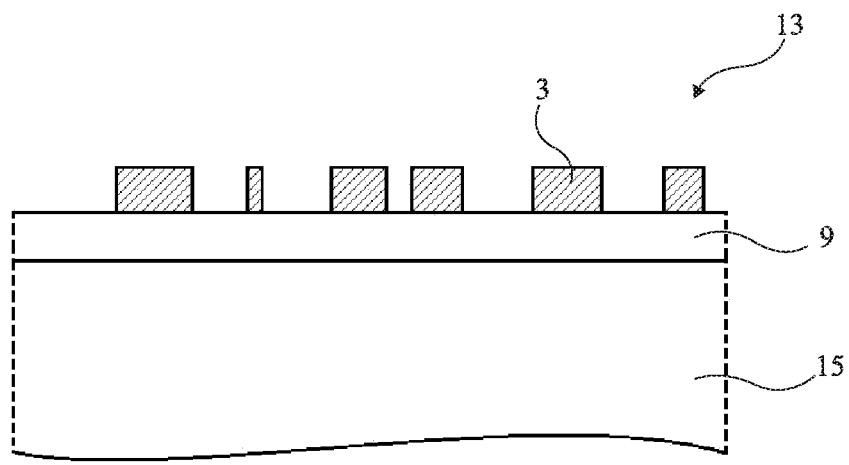

In the step in FIG. 2B, from the openings of the first mask 19, openings have been etched in the layer 17 of silicon nitride, e.g., by reactive plasma etching (commonly referred to as RIE for "Reactive Ionic Etching") up to the layer 9 of silicon oxide leaving patterns 3 in place. The etching is stopped on the layer 9, which is possible because of the very good etching selectivity of silicon nitride with respect to silicon oxide. The mask 19 has then been removed.

Figure 2C:
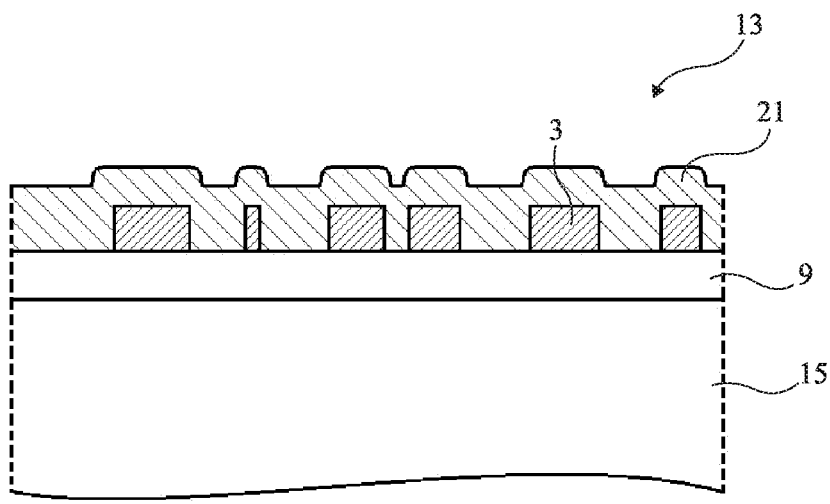

In the step in FIG. 2C, a layer 21 of polycrystalline or amorphous silicon has been deposited on the wafer 13, on the side of the patterns 3 made of silicon nitride. The layer 21 has a sufficient thickness and is deposited according to a suitable method in such a way as to completely fill the spaces between the patterns 3. The layer 21 may, for example, have a thickness greater than that of the patterns 3. A method of vapor phase chemical deposition may, for example, be suitable for filling the openings between the patterns 3. Polycrystalline or amorphous silicon is selected since it is selectively etchable with respect to silicon nitride. In an advantageous manner, polycrystalline or amorphous silicon is suitable for filling the spaces between the patterns 3, even when the form factor of these openings is high.

Figure 2D:
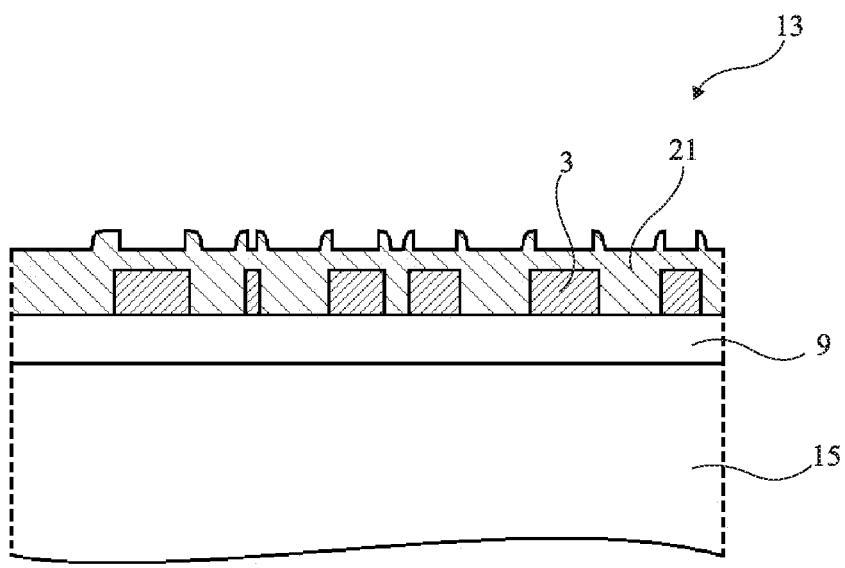

The step illustrated by FIG. 2D is an optional but preferred step. In this step, a second etching mask (not represented) has been formed on the layer 21 of polycrystalline or amorphous silicon, the mask including openings opposite the patterns 3 made of silicon nitride. This second mask is complementary to the first mask used in the step in FIG. 2B, i.e., the full parts of the second mask are arranged at locations corresponding to the openings of the first mask, and the openings of the second mask are arranged at locations corresponding to the full parts of the first mask. The openings of the second mask may have slightly smaller dimensions, e.g., 200 nm to 400 nm, than those of the corresponding full parts of the first mask. At least one part of the thickness of the polycrystalline or amorphous silicon of the layer 21 has been etched from the openings of the second mask, then the second mask has been eliminated.

Figure 2E:
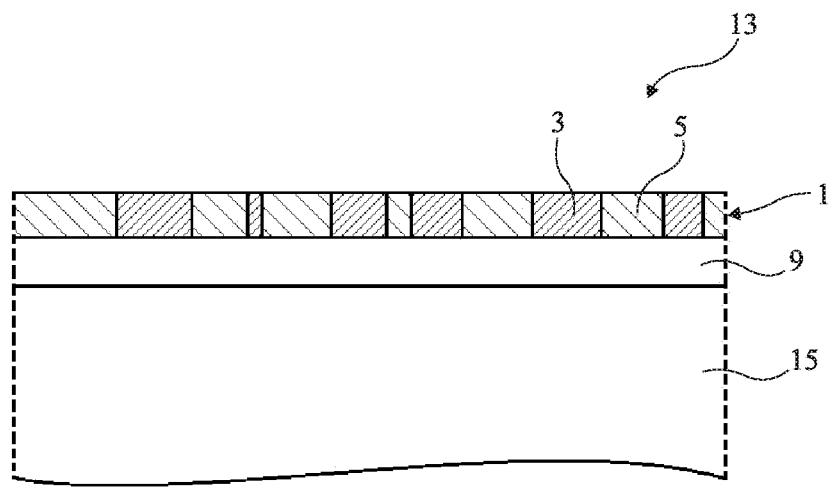

In the step in FIG. 2E, the polycrystalline or amorphous silicon has been smoothed by CMP ("Chemical-Mechanical Polishing") up to the upper level of the patterns 3 made of silicon nitride for forming the complementary patterns 5 made of polycrystalline or amorphous silicon of the diffusing layer 1.

When the step of CMP is carried out without the step in FIG. 2D having been performed, as the large bumps of polycrystalline or amorphous silicon above the patterns 3 made of silicon nitride are removed by CMP, polycrystalline or amorphous silicon is also removed in the hollows of the layer 21. Once the step of CMP is complete, these hollows may thus end up at the level of the upper face of the diffusing layer 1 which is not desirable.

When the step of CMP is carried out after the preferred step in FIG. 2D has been carried out, the large bumps of polycrystalline or amorphous silicon have been reduced to small rough patches (see FIG. 2D), which are removed, broken up or extracted at the beginning of the step of CMP. The result is that the upper face of the layer 21 is substantially flat at the beginning of the step of CMP and the diffusing layer 1 obtained at the end of the step of CMP advantageously has a flat upper face.

Moreover, the fact that the usual methods of chemical-mechanical polishing of polycrystalline or amorphous silicon are very selective with regard to silicon nitride, i.e., they polish the latter much less quickly than the polycrystalline or amorphous silicon, the thickness of the patterns 3 made of silicon nitride is not altered or is very little altered during this step of smoothing, and the diffusing layer 1 obtained therefore advantageously has the desired thickness.

Figure 2F:
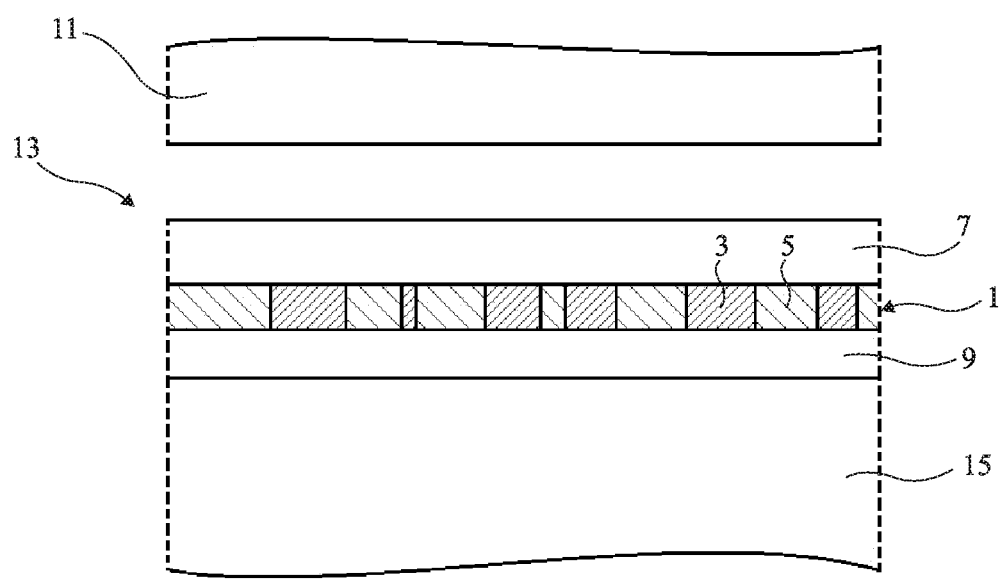

In the step in FIG. 2F, a layer 7 of silicon oxide has been formed on the diffusing layer 1, e.g., by vapor phase chemical deposition. The thickness of the layer 7 is, for example, between 400 and 800 nm, e.g., 600 nm. A glass substrate or plate 11 is placed opposite the layer 7 of silicon oxide, as represented in FIG. 2F.

Figure 2G:
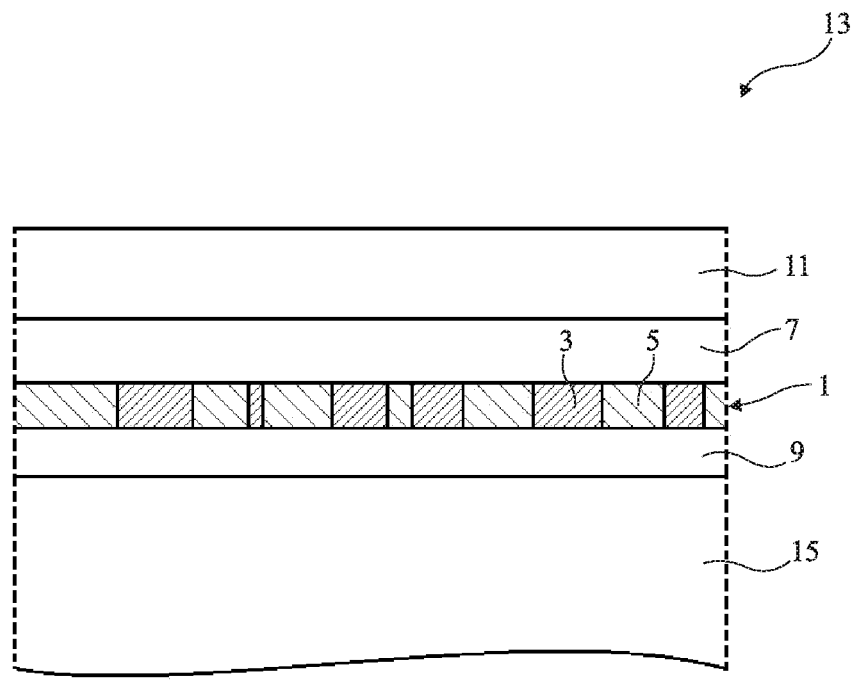

In the step in FIG. 2G, the glass substrate 11 has been bonded by molecular bonding to the layer 7 of silicon oxide, then the glass substrate 11 has been thinned down to a thickness less than or equal to 300 μm. In an advantageous manner, the glass of the substrate 11 and the silicon oxide of the layer 7 are of similar materials having substantially identical optical properties, which makes it possible to limit or even eliminate the parasitic reflections at the interface between the glass substrate 11 and the layer 7.

Figure 2H:
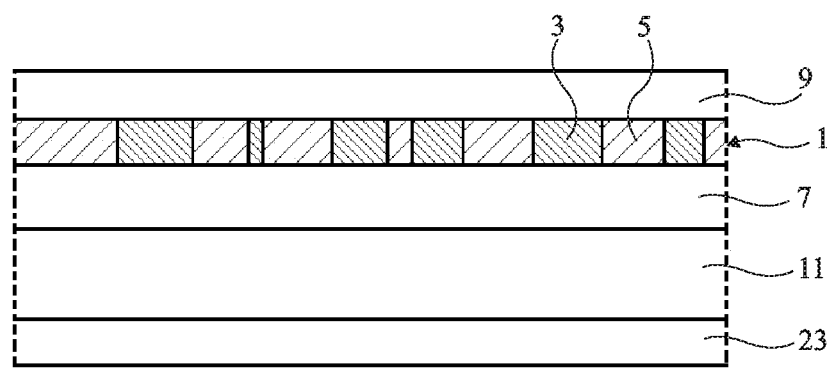

In the step in FIG. 2H, the wafer 13 has been turned over and the thinned glass substrate 11 has been bonded onto an extensible adhesive film 23 mounted on a frame, after which the silicon slice 15 is eliminated, by polishing (CMP) or by grinding. This elimination of the silicon slice may be carried out before the bonding onto the extensible adhesive film 23, after transferring the wafer onto a temporary handle which is then removed.

In a following step not illustrated, the wafer 13 is cut up into a plurality of identical optical diffusers of the type in FIGS. 1A and 1B, each diffuser being bonded onto a corresponding portion of the film 23.

Figure 3A:
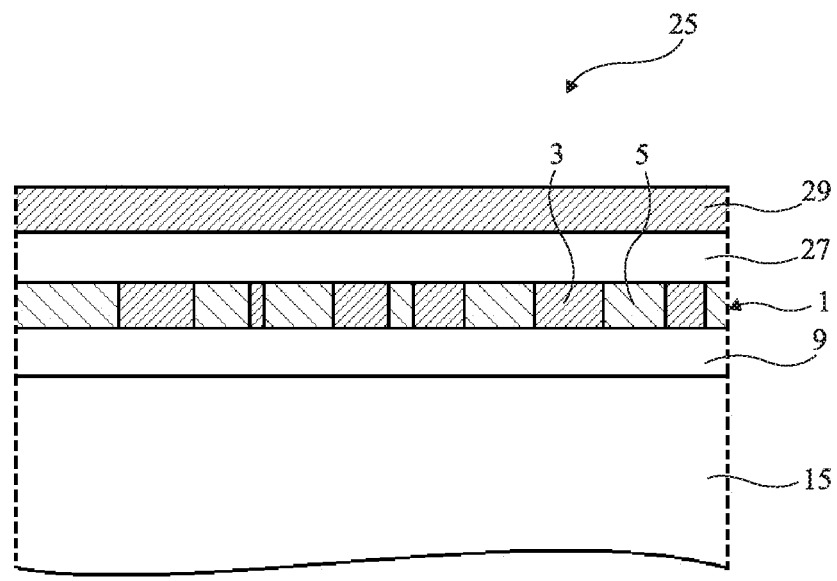
FIGS. 3A and 3B are sectional views illustrating the successive steps of a method of manufacture of a variant of the diffuser in FIGS. 1A and 1B.
Figure 3B:
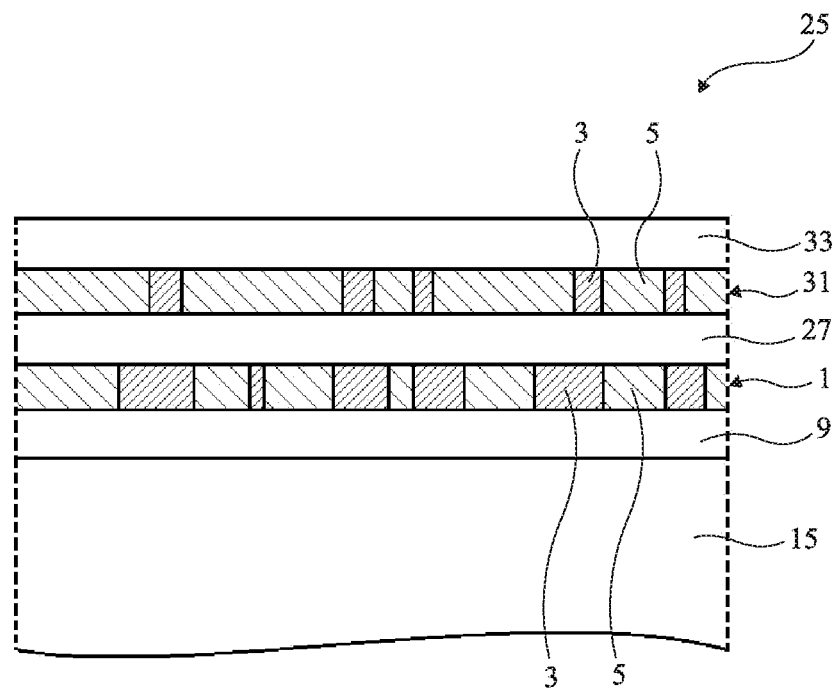

FIGS. 3A and 3B are sectional views illustrating successive steps of a method of manufacture of a variant optical diffuser with two diffusing layers.

FIG. 3A represents a wafer 25 after the steps in FIGS. 2A to 2E, deposition of a layer 27 of silicon oxide on the diffusing layer 1 and deposition of a layer 29 of silicon nitride on the layer 7 of silicon oxide.

In the step in FIG. 3B, openings have been etched in the layer 29 of silicon nitride up to the layer 27 of silicon oxide leaving in place patterns 3 made of silicon nitride. A layer of polycrystalline or amorphous silicon of sufficient thickness has been deposited on the wafer 25, on the side of these patterns 3. This polycrystalline or amorphous silicon has been smoothed up to the upper level of the patterns 3 defined in the layer 29, e.g., in the manner described in relation to FIGS. 2D and 2E, for forming the complementary patterns 5 made of polycrystalline or amorphous silicon of an additional diffusing layer 31. A layer 33 of silicon oxide has then been deposited on the diffusing layer 31.

In subsequent steps not illustrated, but will be understood in view of FIGS. 1A and 2G, the glass substrate 11 is bonded to the layer 33 of silicon oxide, the bonding may be by molecular bonding, the substrate 11 is thinned, the semiconductor slice 15 is eliminated then the wafer is bonded to an extensible adhesive film mounted on a frame similar to the film 23 in FIG. 2H. The wafer 25 obtained is then cut or sawn to obtain a plurality of individual optical diffusers.

In this variant, in the step in FIG. 3A, the thickness of the layer 27 of silicon oxide is selected so as to optimize the optical properties (maximum transmission and minimum reflections) of the manufactured diffusers. For example, the thickness of this layer is selected equal to an odd multiple of a quarter of the wavelength of the beam to be diffused, in the silicon oxide of the layer 27, so as to limit or even eliminate the parasite reflections in the layer 27.

The diffusers obtained by the method described in relation to FIGS. 3A and 3B each include the diffusing layer 1 sandwiched between, and in contact with, the two layers 9 and 27 of silicon oxide, and the diffusing layer 31 sandwiched between, and in contact with, the two layers 27 and 33 of silicon oxide, the stack of successive layers 33, 31, 27, 1 and 9 resting on the substrate 11. As previously, for a given application, the determination of the shape of the patterns 3, 5 of each diffusing layer 1, 31 and of the thickness of each of the layers 9, 1, 31 and 33 is within the grasp of the person skilled in the art.

The method of manufacture described in relation to FIGS. 3A and 3B may be brought into general use in the manufacture of optical diffusers including more than two diffusing layers.

FIGS. 4A to 4D are sectional views illustrating the successive steps of a method of manufacture of another variant of an optical diffuser. In this variant, at least some of the patterns 3 made of silicon nitride of the diffusing layer of the diffuser consist of stacked portions of silicon nitride.

Figure 4A:
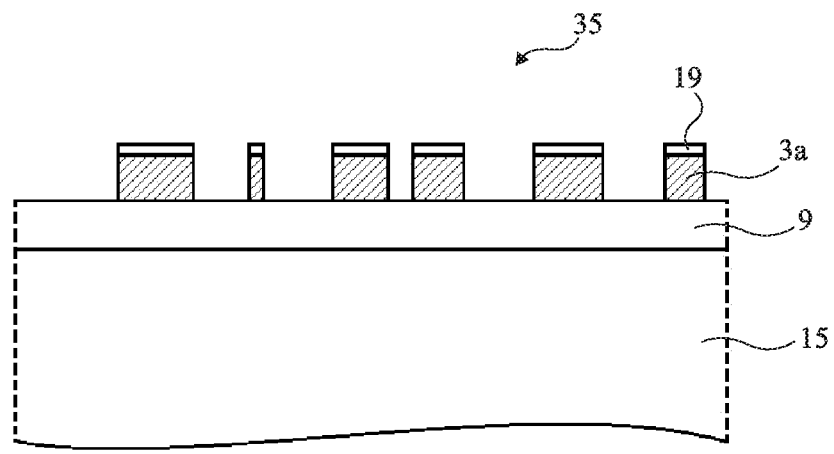
FIGS. 4A to 4D are sectional views illustrating the successive steps of a method of manufacture of another variant of the diffuser in FIGS. 1A and 1B.

FIG. 4A represents a wafer 35 obtained after the steps described in relation to FIGS. 2A and 2B in the case where the masking layer 19 is a layer of silicon oxide resting on and in contact with the layer of silicon nitride, and the portions of the masking layer 19 are left in place after etching the layer 17. Thus, as seen in FIG. 4A, portions 3a made of silicon nitride have been defined in the layer 17 and are each covered with a portion of the masking layer 19 made of silicon oxide. It will be noted that, in this variant, the thickness of the layer 17 of silicon nitride formed in the step in FIG. 2A is not equal to that of the diffusing layer that is intended to be manufactured.

Figure 4B:
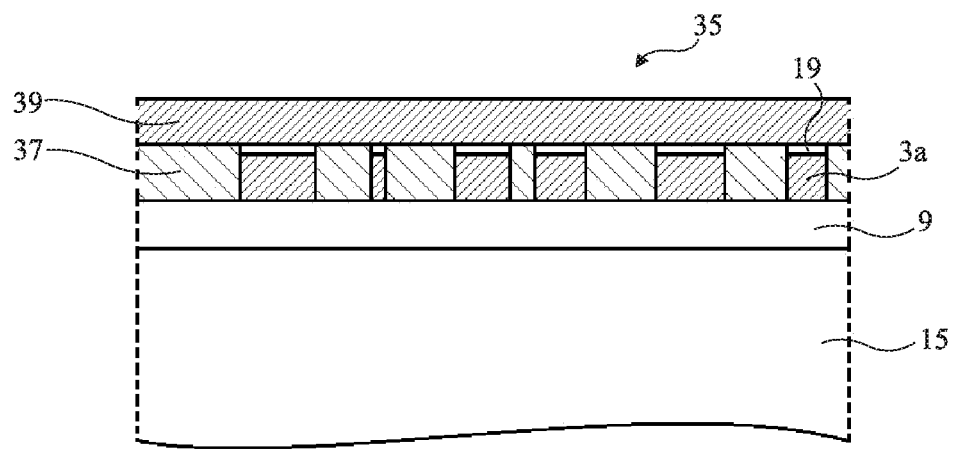

FIG. 4B represents the wafer 35 in FIG. 4A after deposition on the wafer, on the side of the portions 3a made of silicon nitride, of a layer 37 of polycrystalline or amorphous silicon of sufficient thickness. The layer 37 has been smoothed up to the upper level of the masking layer 19, e.g., in a manner similar to that described in relation to FIGS. 2D and 2E. A layer 39 of silicon nitride has been deposited on the upper face of the wafer 35.

Figure 4C:
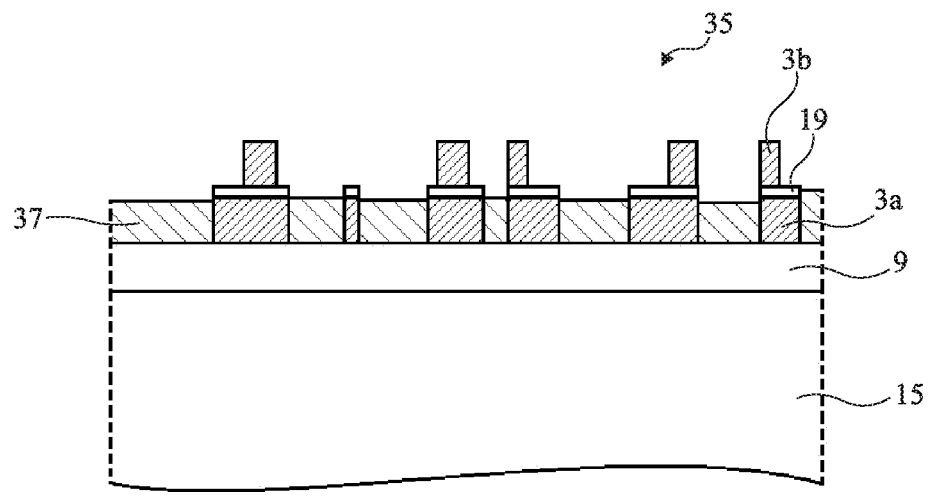

FIG. 4C represents the wafer 35 in FIG. 4B after formation of an etching mask (not represented) on the layer 39 of silicon nitride. The mask includes openings each of which is opposite a portion 3a made of silicon nitride and the lateral dimensions of which are less than or equal to those of this portion 3a. From the openings of the mask, openings have been etched in the layer 39 of silicon nitride, the etching being stopped on the portions of the masking layer 19. Thus, portions 3b made of silicon nitride have been defined in the layer 39, each portion 3b resting on and in contact with a portion of the masking layer 19 made of silicon oxide covering the upper face of a corresponding portion 3a. As represented in FIG. 4C, the polycrystalline or amorphous silicon of the layer 37 may be partially etched during the etching of the silicon nitride of the layer 39.

In an advantageous manner, the layer 19 of silicon oxide formed in the step in FIG. 2A for serving as an etching mask is advantageously reused in the step in FIG. 4C as a stop layer for etching the silicon nitride of the layer 39.

Figure 4D:
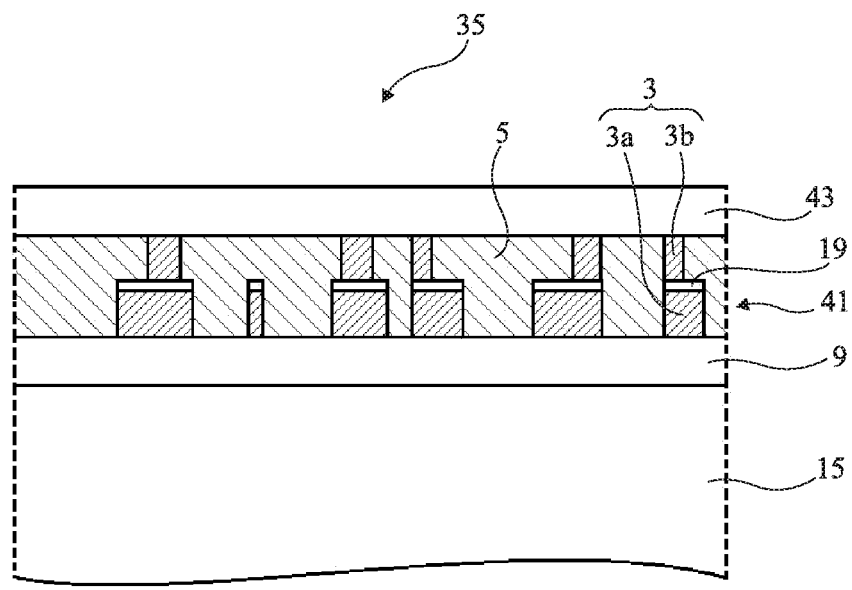

FIG. 4D represents the wafer 35 in FIG. 4C after deposition on the wafer, on the side of the portions 3a and 3b made of silicon nitride, of a layer of polycrystalline or amorphous silicon of a sufficient thickness. Thus, although the polycrystalline or amorphous silicon could be partially etched in the step in FIG. 4C, this etching is entirely offset by the deposition of polycrystalline or amorphous silicon carried out in the step in FIG. 4D. The layer of polycrystalline or amorphous silicon has then been smoothed, e.g., in the way described in relation to FIGS. 2D and 2E, up to the upper level of the portions 3b of silicon nitride for forming a diffusing layer 41. The diffusing layer 41 consists of patterns 3 made of silicon nitride and complementary patterns 5 made of polycrystalline or amorphous silicon, at least some of the patterns 3 consisting of two portions 3a and 3b of silicon nitride superposed and separated from each other by a portion of the masking layer 19 made of silicon oxide. A layer 43 of silicon oxide has then been deposited on the diffusing layer 41.

In subsequent steps not illustrated, the glass substrate 11 is bonded to the layer 43 of silicon oxide, the semiconductor slice 15 is eliminated, the substrate 11 is thinned, then the wafer is bonded to an extensible adhesive film mounted on a frame similar to the film 23 in FIG. 2H. The wafer 35 thus obtained is then cut up for individually separating the optical diffusers which are formed thereby.

The diffusers obtained by the method described in relation to FIGS. 4A to 4D each include the diffusing layer 41 sandwiched between, and in contact with, the two layers 9 and 43 of silicon oxide, the layer 43 resting on the glass substrate 11 (not represented). As previously, for a given application, the determination of the shape of the portions 3a and 3b of the patterns 3 made of silicon nitride, and of the thickness of each of the layers 9, 41, 19 and 43, is within the grasp of the person skilled in the art. For example, the thickness of the masking layer 19 of silicon oxide is selected such that after the step described in relation to FIG. 4B its thickness is less than 10 nm, preferably 5 nm, which interferes very little or not at all with the operation of the manufactured optical diffusers.

The method described in relation to FIGS. 4A to 4D may be brought into general use in the manufacture of diffusers in which the diffusing layer 41 includes patterns 3 made of silicon nitride having more than two superposed portions of silicon nitride.

The methods described in relation to FIGS. 2A to 2H, 3A and 3B, and 4A to 4C make it possible to manufacture diffusers having flat upper and lower faces, which facilitates the assembly of same on an integrated circuit chip.

Particular embodiments have been described. Various variants and modifications will be apparent to the person skilled in the art. In particular, although patterns 3, 5 have been described as having "organic" shapes, other types of patterns may be provided. For example, notably in the case of the variant embodiment in FIGS. 4A to 4D, the patterns 3 may be selected for forming a Fresnel lens, the patterns 3 then having the shape of concentric rings.

In the methods described above, the layer of silicon oxide onto which the glass substrate 11 is bonded may be omitted, the substrate 11 then being bonded directly onto a diffusing layer. Furthermore, additional layers, e.g., anti-reflective layers, may be provided between the semiconductor slice 15 and the layer 9 of silicon oxide, and/or between the glass substrate 11 and the layer of silicon oxide 7, 33 or 43 on which the substrate 1 rests.

Furthermore, although manufacturing methods have been described in the case where optical diffusers are produced, these methods are suitable for producing other passive optical devices including, on a thinned glass substrate, a layer consisting of patterns made of a first material separated from each other by complementary patterns made of a second material, this layer being sandwiched between two layers of a third material.

Various embodiments with various variants have been described above. It will be noted that the person skilled in the art will be able to combine various elements of these various embodiments and variants without exercising inventive skill.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
forming at least one optical diffuser, the forming of the at least one optical diffuser including:
  forming a first layer of a first material on a silicon wafer;
  forming a second layer of a second material on the first layer to form a stack, the second layer having a plurality of openings;
  filling the plurality of openings in the second layer with a third layer of a third material, the second and third layers forming a diffusing layer of the at least one optical diffuser;
  forming a fourth layer of the first material on the second and third layers;
  bonding, while the first, second, third, and fourth layers are physically coupled to the silicon wafer, a glass substrate to the fourth layer, the glass substrate being spaced from the silicon wafer by the first, second, third, and fourth layers after being bonded to the fourth layer; and
  completely removing the silicon wafer from the first, second, third, and fourth layers subsequent to the bonding of the glass substrate to the fourth layer.

2. The method according to claim 1, wherein filling the plurality of openings includes depositing the third layer of the third material at a thickness that fills the plurality of openings in the second layer, the method further includes polishing the third layer such that a surface of the third layer and a surface of the second layer are coplanar.

3. The method according to claim 2, wherein forming the second layer includes:
depositing a blanket layer over the first layer;
forming a first mask over the blanket layer; and
etching the plurality of openings in the blanket layer to form the second layer; wherein the method further includes:
  forming, prior to polishing the third layer and on the third layer, a second mask that is complementary to the first mask; and
  removing, according to a pattern of the second mask, portions of the third layer.

4. The method according to claim 2, further comprising:
depositing, prior to polishing the third layer and bonding the glass substrate, a fifth layer over the second layer and the third layer, the fifth layer including the first material;
depositing a sixth layer made of the second material on the fifth layer;
forming a plurality of through openings in the sixth layer;
depositing a seventh layer of the third material, a thickness of the seventh layer being greater than a thickness of the sixth layer; and
polishing the seventh layer such that a surface of the seventh layer and a surface of the sixth layer are coplanar.

5. The method according to claim 2, wherein forming the second layer of the second material includes:
depositing a blanket layer of the second material;
forming a masking layer abutting the blanket layer, the masking layer including a plurality of openings; and
etching the blanket layer through the plurality of openings to form the second layer,
wherein the masking layer is left in place when the third layer is deposited,
wherein the third layer is polished to expose an upper level of the masking layer, and
wherein the method further includes:
  depositing, prior to forming the fourth layer and bonding the glass substrate, a fifth layer of the second material over the third layer and the masking layer;
  forming, prior to forming the fourth layer and bonding the glass substrate, openings in the fifth layer by etching up to the masking layer;
  depositing, prior to forming the fourth layer and bonding the glass substrate, a sixth layer made of the third material, a thickness of the sixth layer being greater than a thickness of the fifth layer; and
  polishing the sixth layer to expose the fifth layer.

6. The method according to claim 1, wherein the first material is silicon oxide, the second material is silicon nitride, and the third material is polycrystalline or amorphous silicon.

7. An optical diffuser comprising:
a first layer of a first material;
a second layer of a second material on the first layer, the second layer including a plurality of through openings, at least one of the plurality of through openings in the second layer having a shape that lacks symmetry;
a third layer of a third material in the plurality of through openings in the second layer;
a fourth layer of the first material on the second and third layers;
a fifth layer of the second material on the fourth layer, the fifth layer including a plurality of through openings, at least one of the plurality of through openings in the fifth layer having a shape that lacks symmetry,
a sixth layer of the third material in the plurality of through openings in the fifth layer;
a seventh layer of the first material on the fifth and sixth layers; and
a glass substrate on the seventh layer.

8. The optical diffuser according to claim 7, wherein the first material is silicon oxide, the second material is silicon nitride, and the third material is polycrystalline or amorphous silicon.

9. A method comprising:
forming at least one optical diffuser, the forming of the at least one optical diffuser including:
  forming, on a silicon wafer, a first layer of a first material;
  forming, on the first layer of the first material, a second layer of a second material;
  forming a plurality of through openings in the second layer, at least one of the plurality of through openings in the second layer having a shape that lacks symmetry;
  forming a third layer of a third material in the plurality of through openings in the second layer, the second and third layers forming a diffusing layer of the at least one optical diffuser;
  forming, on the second and third layers, a fourth layer of the first material;
  placing, while the first, second, third, and fourth layers are on the silicon wafer, a glass substrate on the fourth layer, the glass substrate being spaced from the silicon wafer by the first, second, third, and fourth layers after being placed on the fourth layer; and
  completely separating the silicon wafer from the first, second, third, and fourth layers subsequent to the placing of the glass substrate on the fourth layer.

10. The method according to claim 9, further comprising planarizing, prior to placing the glass substrate, the second and third layers to form a planar surface.

11. The method according to claim 10, further comprising:
   forming, prior to forming the fourth layer and placing the glass substrate, a fourth fifth layer of the first material over the planar surface;
   forming a sixth layer of the second material over the fifth layer, the sixth layer including a plurality of through openings, at least one of the plurality of through openings in the sixth layer having a shape that lacks symmetry;
   filling the plurality of through openings in the sixth layer with a seventh layer of the third material.

12. The method according to claim 11, further comprising polishing the sixth and seventh layers are polished to form another planar surface.

13. The method according to claim 9, wherein forming the plurality of through openings in the second layer includes forming a masking layer on the second layer.

14. The method according to claim 1, wherein
   the forming of the at least one optical diffuser includes thinning the glass substrate subsequent to the bonding of the glass substrate to the fourth layer, and
   the silicon wafer is completely removed subsequent to the thinning of the glass substrate.

15. The method according to claim 1, wherein the forming of the at least one optical diffuser includes forming an adhesive film on the glass substrate subsequent to the removing of the silicon wafer, the adhesive film being spaced from the fourth layer by the glass substrate.

\* \* \* \* \*

UNITED STATES PATENT AND TRADEMARK OFFICE
CERTIFICATE OF CORRECTION

Page 1 of 1

PATENT NO. : 11,150,388 B2
APPLICATION NO. : 15/610150
DATED : October 19, 2021
INVENTOR(S) : Vincent Farys et al.

It is certified that error appears in the above-identified patent and that said Letters Patent is hereby corrected as shown below:

In the Claims

Column 11, Claim 11, Line 7:
"a fourth fifth layer" should read: --a fifth layer--.

Signed and Sealed this
Seventeenth Day of May, 2022

Katherine Kelly Vidal
*Director of the United States Patent and Trademark Office*